United States Patent [19]

Ikenaga et al.

[11] Patent Number: 4,737,398
[45] Date of Patent: Apr. 12, 1988

[54] METALLIC FILM WITH LAMINATED LAYER OF AN ANISOTROPIC MELT PHASE FORMING POLYMER

[75] Inventors: Yukio Ikenaga; Katsuhiko Takahashi, both of Fuji; Tsuneyoshi Okada, Kawasaki; Kenji Hijikata; Toshio Kanoe, both of Fuji, all of Japan

[73] Assignee: Polyplastics Co., Ltd., Osaka, Japan

[21] Appl. No.: 801,869

[22] Filed: Nov. 26, 1985

[30] Foreign Application Priority Data

Nov. 28, 1984 [JP] Japan .................................. 59-251293

[51] Int. Cl.$^4$ ........................ B32B 15/08; B32B 27/36

[52] U.S. Cl. ................................. 428/216; 428/421; 428/419; 428/328; 428/325; 428/331; 428/423.7; 428/425.8; 428/425.9; 428/458; 428/324; 428/462; 428/460; 428/463; 428/469; 428/473.5; 428/412; 428/475.5; 428/480; 428/461

[58] Field of Search ............... 428/462, 460, 463, 461, 428/469, 412, 473.5, 475.5, 324, 421, 419, 423.7, 425.8, 425.9, 325, 328, 331, 480, 216, 458

[56] References Cited

U.S. PATENT DOCUMENTS 4,275,099  6/1981  Dani ................................ 428/458 X
4,304,883  12/1981  Fujii et al. ...................... 428/458 X

*Primary Examiner*—P. C. Ives
*Attorney, Agent, or Firm*—Birch, Stewart, Kolasch & Birch

[57] ABSTRACT

A laminated film comprises a metallic film and a polymer layer which has been laminated on the metallic film, the polymer being anisotropic in the melt phase.

46 Claims, No Drawings

METALLIC FILM WITH LAMINATED LAYER OF AN ANISOTROPIC MELT PHASE FORMING POLYMER

The invention relates to a laminated film and an industrial method of continuously manufacturing a high-strength multilayer laminated film including at least one layer of an anisotropic melt-phase forming polymer.

STATEMENT OF PRIOR ARTS

It is known that an anisotropic melt-phase forming polymer known as a thermotropic liquid-crystalline polymer has a very high strength in the direction of its orientation because of its orientational anisotropy and yet has a very high resistance to chemicals because of its superficial denseness. However, it has a drawback that its strength is substantially lower in a direction perpendicular to the direction of its orientation than that in the latter direction, which makes it difficult to process the polymer into a film in a conventional continuous operation, or which, if the polymer is produced into a film, limits the use of such film in many applications.

Hitherto, various methods have been proposed for the manufacture of a sheet or film formed of a thermotropic liquid-crystalline polymer and having desired characteristics in a multidirectional way. In Japanese published unexamined patent application Nos. 4626/81, 46727/81, and 161821/80, for example, it is proposed to internally plasticize the molecular structure of such polymer, or to plasticize the polymer by blending a plasticizer or the like therewith. This idea has a disadvantage in that the anisotropy of the polymer is rather unjustifiably reduced in connection with the melt forming operation, which results in considerable loss in strength.

In Japanese published unexamined patent applications No. 31718/83 there is proposed a multiaxially oriented laminate in which monoaxially oriented sheets of a thermotropic liquid-crystalline polymer are laminated one over another. Apparently such laminate has high strength, since it consists of sheets having different axial patterns. However, the trouble is that it is difficult to laminate two sheets into bond in a continuous operation so that their orientational axis are in an angled relation at a certain degree. Such a way of laminating is not economical, and can never be said to be satisfactory for industrial purposes.

SUMMARY OF THE INVENTION

The object of the present invention is to accomplish a technical task of converting a thermotropic liquid-crystalline polymer into a film while retaining its characteristic features, high orientation and high strength, as such.

Accordingly, the invention provides a method of manufacturing a laminated film which comprises melt forming a layer or layers of an anisotropic melt-phase forming polymer on a metallic film to produce a multilayer laminated film.

In other words, according to the invention, a laminated film is manufactured by the step of melting and laminating a polymer which is anisotropic in the melt phase on a metallic film. A laminated film of the invention is defined to comprise a metallic film and a polymer layer which has been laminated on the metallic film, the polymer being anisotropic in the melt phase.

In accordance with the invention, an anisotropic melt-phase forming polymer is complexed with a metallic film into a composite laminate Thus a method for continuous industrial production is provided for a multilaminated film having exceptionally high chemical resistance and excellent gas barrier properties and further having good mechanical strength.

The anisotropic melt phase forming polymer used in the laminated film in accordance with the invention may be any melt-processable thermoplastic polymer compound which exhibits an optionally anisotropic behavior when it is molten and is generally classified as a thermotropic liquid-crystalline polymer.

Any such anisotropic melt phase forming polymer has a characteristic feature such that when the polymer is in molten state its molecular chains are in a regular parallel array. Such molecular arrangement is often called a liquid crystalline state or nematic phase of a liquid-crystalline substance. Such a polymer is produced from monomers having a plurality of extended chain links which are generally elongate, flat, and substantially rigid along a main molecular axis and which are usually in either coaxial or parallel relation.

The feature of an anisotropic melt phase can be confirmed by a conventional polarization test utilizing crossed polarizers. More specifically, the anisotropic melt phase can be confirmed by observing a specimen placed on a Leitz hot stage in a nitrogen atmosphere using a Leitz polarization microscope at 40×magnification. Aforesaid polymer is optically anisotropic. That is, when examined between crossed polarizers, the polymer allows light transmission through it. When the specimen is optically anisotropic, polarized light transmits therethrough, even if the specimen is static.

Components of aforesaid anisotropic melt-phase forming polymer may comprise:

① one or more of aromatic dicarboxylic acids and alicyclic dicarboxylic acids;

② one or more of aromatic diols, alicyclic diols, and aliphatic diols;

③ one or more of aromatic hydroxy-carboxylic acids;

④ one or more of aromatic thiocarboxylic acids;

⑤ one or more of aromatic dithiols and aromatic thiophenols; and/or

⑥ one or more of aromatic hydroxylamines and aromatic diamines.

Accordingly, an anistropic melt phase forming polymer may comprise:

(I) a polyester containing components ① and ②

(II) a polyester containing component ③ only;

(III) a polyester containing components ①, ② and ③; or (IV) a polythioester containing component ④ only; or (V) a polythioester containing components ① and ⑤; or (VI) a polythioester containing components ①, ④ and ⑤; or (VII) a polyester amide containing components ①, ③ and ⑥; or (VIII) a polyester amide containing components ①, ②, ③ and ⑥.

Further, though not included in the category of the above mentioned combinations of components, aromatic polyazomethynes may be cited as polymers capable of forming an anisotropic melt phase. Typical examples of such polymers are poly-(nitrilo-2-methyl-1,4-phenylene nitriloethylidene-1,4-phenylene ethylidene); poly-(nitrilo-2-methyl-1,4-phenylene nitrilomethylidene-1,4-phenylene methylidene); and poly-(nitrilo-2-chloro-1,4-phenylene nitrilomethylidene-1,4-phenylene methylidene).

Still further, though not included in the category of the above mentioned combinations of components, polyester carbonates may be cited as anisotropic melt-phase forming polymers. Among them are those consisting essentially of 4-oxybenzoyl units, dioxyphenyl units, dioxycarbonyl units, and terephthaloyl units.

Chemical compounds which may be components of aforesaid items (I)~(VIII) are listed below.

Among aromatic dicarboxylic acids are: terephthalic acid, 4,4'-diphenyl dicarboxylic acid, 4,4'-triphenyl dicarboxylic acid, 2,6-naphthalene dicarboxylic acid, diphenyl ether-4,4'-dicarboxylic acid, diphenoxy ethane-4,4'-dicarboxylic acid, diphenoxy butane-4,4'-dicarboxylic acid, diphenyl ethane-4,4'-dicarboxylic acid, isophthalic acid, diphenyl ether-3,3'-dicarboxylic acid, diphenoxy ethane-3,3'-dicarboxylic acid, diphenyl ethane-3,3'-dicarboxylic acid, and naphthalene-1,6-dicarboxylic acid; or alkyl-, alkoxy-, or halogen-substituted ones of these aromatic dicarboxylic acids, such as chloroterephthalic acid, dichloroterephthalic acid, bromoterephthalic acid, methyl terephthalic acid, dimethyl terephthalic acid, ethyl terephthalic acid, methoxy terephthalic acid, and ethoxy terephthalic acid.

Among alicyclic dicarboxylic acids are: trans-1,4-cyclohexane dicarboxylic acid, cis-1,4-cyclohexane dicarboxylic acid, and 1,3-cyclohexane dicarboxylic acid; or alkyl-, alkoxy-, or halogen substituted ones of these alicyclic dicarboxylic acids, such as trans-1,4-(1-methyl)cyclohexane dicarboxylic acid, and trans-1,4-(1-chloro)cyclohexane dicarboxylic acid.

Among aromatic diols are: hydroquinone, resorcinol, 4,4'-dihydroxy diphenyl, 4,4'-dihydroxy triphenyl, 2,6-naphthalene diol, 4,4'-dihydroxy diphenyl ether, bis-(4-hydroxyphenoxy)ethane, 3,3'-dihydroxy diphenyl, 3,3'-dihydroxy diphenyl ether, 1,6-naphthalene diol, 2,2-bis(4-hydroxy phenyl)propane, and 2,2-bis(4-hydrody-phenyl)methane; or alkyl-, alkoxy-, or halogen-substituted ones of these aromatic diols.

Among alicyclic diols are: trans-1,4-cyclohexane diol, cis-1,4-cyclohexane diol, trans-1,4-cyclohexane dimethanol, trans-1,3-cyclohexane diol, cis-1,2-cyclohexane diol, and trans-1,3-cyclohexane dimethanol; or alkyl-, alkoxy-, or halogen-substituted ones of these alicyclic diols, such as trans-1,4-(1-methyl)cyclohexane diol, and trans-1,4-(1-chloro)cyclohexane diol.

Among aliphatic diols are: linear chain or branched aliphatic diols such as ethylene glycol, 1,3-propane diol, 1,4-butane diol, and neopentyl glycol.

Among aromatic hydroxy-carboxylic acids are: 4-hydroxy benzoic acid, 3-hydroxy benzoic acid, 6-hydroxy-2-naphthoic acid, and 6-hydroxy-1-naphthoic acid; or alkyl-, alkoxy-, or halogen-substituted ones of such aromatic hydroxycarboxylic acids as 3-methyl-4-hydroxy benzoic acid, 3,5-dimethyl-4-hydroxy benzoic acid, 2,6-dimethyl-4-hydroxy benzoic acid, 3-methoxy-4-hydroxy benzoic acid, 3,5-dimethoxy-4-hydroxy benzoic acid, 6-hydroxy-5-methyl-2-naphthoic acid, 6-hydroxy-5-methoxy-2-naphthoic acid, 3-chloro-4-hydroxy benzoic acid, 2-chloro-4-hydroxy benzoic acid, 2,3-dichloro-4-hydroxy benzoic acid, 3,5-dichloro-4-hydroxy benzoic acid, 2,5-dichloro-4-hydroxy benzoic acid, 3-bromo-4-hydroxy benzoic acid, 6-hydroxy-5-chloro-2-naphthoic acid, 6-hydroxy-7-chloro-2-naphthoic acid, and 6-hydroxy-5,7-dichloro-2-naphthoic acid.

Among aromatic mercaptocarboxylic acids are: 4-mercaptobenzoic acid, 3-mercaptobenzoic acid, 6-mercapto-2-naphthoic acid, 7-mercapto-2-naphthoic acid.

Among aromatic dithiols are: benzene-1,4-dithiol, benzene-1,3-dithiol, 2,6-naphthalene-dithiol, and 2,7-naphthalene-dithiol.

Among aromatic mercaptophenols are: 4-mercaptophenol, 3-mercaptophenol, 6-mercaptophenol, and 7-mercaptophenol.

Among aromatic hydroxyamines and aromatic diamines are: 4-aminophenol, N-methyl-4-aminophenol, 1,4-phenylenediamine, N-methyl-1,4-phenylene-diamine, N,N'-dimethyl-1,4-phenylene-diamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenyl methane, 4-amino-4'-hydroxydiphenyl sulfide, 4,4'-diaminophenyl sulfide (thiodianiline), 4,4'-diaminodiphenyl sulfone, 2,5-diaminotoluene, 4,4'-ethylenedianiline, 4,4'-diaminodiphenoxy ethane, 4,4'-diaminodiphenyl methane (methylene dianiline), and 4,4'-diaminodiphenyl ether (oxydianiline).

The aforesaid polymers (I)~(VIII), with their possible components as above listed, include some which do not form an anisotropic melt phase depending upon the kinds of their components, and the percentages and sequence distribution of the components in the polymer. For the purpose of the present invention, polymers to be used are limited to those of the above listed polymers which are able to form an anisotropic melt phase.

Polyesters in (I), (II), (III) above and polyesters amide in (VIII) above, which are all able to form an anisotropic melt phase suitable for the purpose of the invention, can be produced by employing various esterification methods wherein organic monomer compounds having functional groups which are able to form the required repeating units through condensation are caused to react with each other. Fundamental groups in the organic monomer compounds may be, for example, carboxylic, hydroxyl, ester, acyloxy groups, or acids haloganate, or amine groups. Said organic monomer compounds can be reacted by a melt acidolysis method without allowing the presence of any heat-exchange fluid. In this method, the monomers are first heated together to form a melt solution of reactants. As reaction progresses, solid polymer particles become suspended in the solution. Vacuum may be applied in order to facilitate the removal of volatile matter (e.g. acetic acid or water) produced as a byproduct at a final stage of condensation.

Slurry polymerization techniques may be employed as well in forming a completely aromatic polyester suitable for use for the purpose of the invention. Where this method is employed, solid particles are produced in the state of being suspended in the heat exchange medium.

Whichever of said melt acidolysis method or slurry polymerization method may be employed, the organic monomer reactants for deriving a completely aromatic polyester can be subjected to reaction in their modified form in which the hydroxyl groups of such monomers are esterified (that is, in the form of lower acyl ester). Such lower acyl group is preferably one having about 2–4 carbon atoms. Preferably, esters acetate of such organic monomer reactants are subjected to reaction.

Typical examples of catalysts available for selective use in either the melt acidolysis process or the slurry process are various gaseous acid catalysts, such as dialkyltin oxide (e.g. dibutyltin oxide), diaryltin oxide, titanium dioxide, antimony trioxide, alkoxytitanium silicate, titanium alkoxide, alkaline and alkali earth metal salt of carboxylic acid (e.g. zinc acetate), Lewis (e.g. $BF_3$), and hydrogen halide. Usage of catalysts in generally about 0.001~1 wt%, and more particularly about 0.01~0.2 wt%, on the basis of the total monomer weight.

Completely aromatic polymers suitable for use for the purpose of the invention are generally apt to be substantially insoluble in ordinary solvents, and are therefore unsuitable for being solution processed. As already stated, however, these polymers can easily be processed by conventional melt processing techniques. Completely aromatic polymers of specifically preferred types are somewhat soluble in pentafluorophenol.

Completely aromatic polyesters suitable for the purpose of the invention generally have a weight-average molecular weight of about 2,000~200,000, and preferably about 10,000~50,000. More preferably, their weight-average molecular weight is about 20,000~25,000. While, completely aromatic polyester amides suitable for the purpose generally have a molecular weight of about 5,000~50,000 and preferably about 10,000~30,000, e.g. 15,000~17,000. Measurement of such molecular weight can be done by gel permeation chromatography and other standard methods of measurement which involve no solution forming of the polymer. For example, such molecular weight can be measured by quantitatively determining and groups with respect to a compression molded film by employing infrared spectroscopic analysis techniques.

Aforesaid completely aromatic polyesters and polyester amides generally exhibit a logarithmic viscosity number of at least about 2.0 dl/g, e.g., about 2.0~10.0 dl/g, when they are dissolved at a concentration of 0.1 wt% in pentafluorophenol at 60° C.

Anisotropic melt-phase forming polyesters of the most preferred type for the purpose of the present invention are those which contain about 10 mol% or more of repeating units containing naphthalene parts, such as 6-hydroxy-2-naphthalene, 2,6-dihydroxy naphthalene, and 2,6-dicarboxy naphthalene. Preferred polyester amides are those containing repeating units of aforesaid naphthalene parts and parts containing 4-aminophenol or 1,4-phenylenediamine. More specifically, such polyesters and polyester amides are as follows:

(1) Polyester containing the following repeating units I and II:

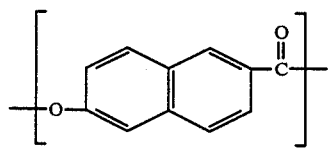

I

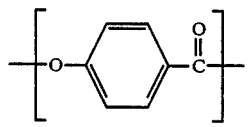

II

This polyester contains about 10~90 mol % of unit I and about 10~90 mol % of unit II. In one form, unit I is present at a molarity of about 65~85 mol %, and preferably about 70~80 mol % (e.g. about 75 mol %). In another form, unit II is present at a far much lower molar concentration of about 15~35 mol %, and preferably about 20~30 mol %. In some cases, at least a fraction of the hydrogen atoms in bond with a ring may be replaced by a substituent selected from the group consisting of alkyl groups having 1~4 carbon atoms, alkoxy groups having 1~4 carbon atoms, halogen, phenyl, substituted phenyl, and combinations of them.

(2) Polyester containing the following repeating units III, IV and V:

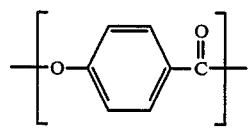

II

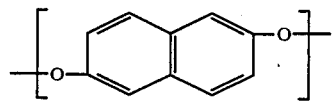

IV

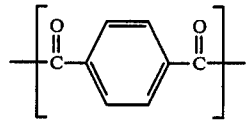

V

This polyester contains about 30~70 mol % of unit III. Preferably, the polyester contains about 40~60 mol % of unit III, about 20~30 mol % of unit IV, and about 20~30 mol % of unit V. In some cases, at least a fraction of the hydrogen atoms in bond with a ring may be replaced by a substituent selected from the group consisting of alkyl groups having 1~4 carbon atoms, alkoxy groups having 1~4 carbon atoms, halogen, phenyl, substituted phenyl, and combinations of them.

(3) Polyester containing of the following repeating units I, II, III and IV:

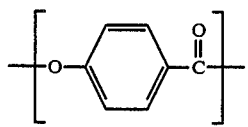

VI

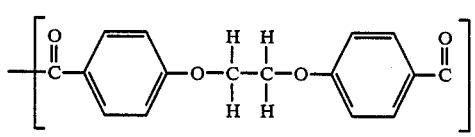

VII

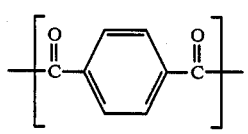

VIII

IX

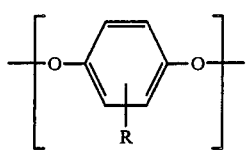

(where R represents methyl, chloro, bromo, or a combination of them, being a substituent for a hydrogen atom on an aromatic ring). This polyester contains about 20~60 mol % of unit VI, about 5~18 mol % of unit VII, about 5~35 mol % of unit V, and about 20~40 mol % of unit IX. Preferably, the polyester contains about 35~45 mol %, about 10~15 mol % of unit VII, about 15~25 mol % of unit VIII, and about 25~35 mol % of unit IX. Provided that the combined molarity of units VII and VIII is substantially equal to the morality of unit iX. In some cases, at least a fraction of the hydrogen atoms in bond with a ring may be replaced by a substituent selected from the group consisting of alkyl groups having 1~4 carbon atoms, alkoxy groups having 1~4 carbon atoms, halogen, phenyl, substituted phenyl, and combinations. When dissolved at a concentration of 0.3 W/V % in pentafluorophenol at 60° C., this completely aromatic polyester generally shows a logarithmic viscosity number of at least 2.0 dl/g, e.g. 2.0~10.0 dl/g.

(4) Polyester containing the following repeating units X, XI, XII, and XIII:

X

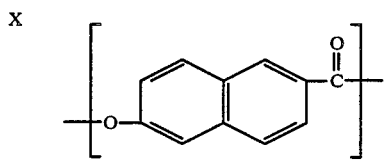

XI

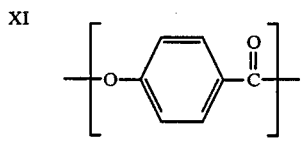

XII    a dioxyaryl unit expressed by general formula
$+O-Ar-O+$ (wherein Ar represents a bivalent group containing at least one aromatic ring);
XIII    a dicarboxyaryl unit expressed by general formula
$+\overset{O}{\overset{\|}{C}}-Ar'-\overset{O}{\overset{\|}{C}}+$ (wherein Ar' represents a bivalent group containing at least one aromatic ring).

This polyester contains about 20~40 % of unit X, more than 10 mol % but less than about 50 mol % of unit XI. more than 5 mol % but less than about 30% of unit XII, and more than 5 mol % but less than about 30 mol % of unit XIII. Preferably, the polyester contains about 20~30 mol % (e.g. about 25 mol %) of unit X, about 25~40 mol % (e.g. about 35 mol %) of unit XI, about 15~25 mol % (e.g. about 20 mol %) of unit XII, and about 15~25 mol % (e.g. about 20 mol %) of unit XIII. In some cases, at least a fraction of the hydrogen atoms in bond with the ring may be replaced by a substituent selected from the group consisting of alkyl groups having 1~4 carbon atoms, alkoxy group having 1~4 carbon atoms, halogen, phenyl, substituted phenyl, and combinations of them.

Units XII and XIII are preferably symmetrical in the sense that, within the main chain of the polymer, the bivalent bonds through which the units are in bond with other units on both sides are symmetrically arranged on one or more aromatic rings. For example, if present on a naphthalene ring or rings, the bivalent bonds are in para relation or on diagonally opposite rings. However, such asymmetrical units as derived from resorcinol and isophthalic may be used.

A preferred form of dixoyaryl units XII is:

A preferred form of dicarboxyaryl unit is:

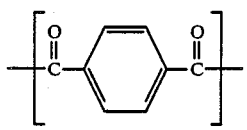

(5) Polyester containing the following repeating units XIV, XV, and XVI:

XIV

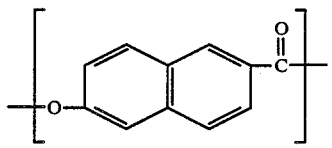

XV    a dioxyaryl unit expressed by general formula
$+O-Ar-O+$ (wherein Ar denotes a bivalent groups including at least one aromatic ring);
XVI    a dicarboxyaryl unit expressed by general formula
$+\overset{O}{\overset{\|}{C}}-Ar'-\overset{O}{\overset{\|}{C}}+$ (wherein Ar' denotes a bivalent group including at least one aromatic ring).

This polyester contains about 10~90 mol % of unit XIV, 5~45 mol % of unit XV, and 5~45 mol % of unit XVI. Preferably, the polyester contains about 20~80 mol % of unit XIV, about 10~40 mol % of unit XV, and about 10~40 mol % of unit XVI. More preferably, the polyester contains about 60~80 mol % of unit XIV, about 10~20 mol % of unit XV, and about 10~20 mol % of unit XVI. In some, case, at least a fraction of the hydrogen atoms in bond with a ring may be replaced by a substituent selected from the groups consisting of alkyl groups having 1~4 carbon atoms, alkoxy groups having 1~4 carbon atoms, halogen, phenyl, substituted phenyl, and combinations of them.

A preferred form of dioxyaryl unit XV is:

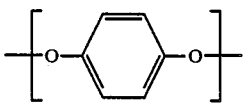

A preferred dicarboxyaryl unit XVI is:

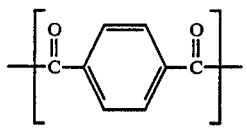

(6) Polyester amide consisting essentially of the following repeating units XVII, XVIII, XIX, and XX:

XVII 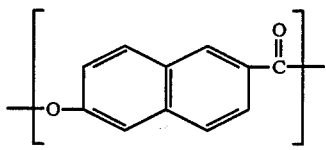

XVIII   a unit expressed by general formula $+C-A-C+$ with two C=O
    (wherein A represents a bivalent group including
    at least one aromatic ring, or a bivalent
    transcyclohexane group);

XIX   a unit expressed by general formula $+Y-Ar-Z+$
    (wherein Ar represents a bivalent group including
    at least one aromatic ring; Y represents O, NH, or
    NR; and Z represents NH or NR; R represents an
    alkyl or aryl group having 1~6 carbon atoms);

XX   a unit expressed by general formula $+O-Ar'-O+$
    (wherein Ar' represents a bivalent group including
    at least one aromatic ring).

This polyester contains about 10~90 mol % of unit XVII, about 5~45 mol % of unit XVIII, about 5~45 mol % of unit IX, and about 0–40 mol % of unit XX, In some cases, at least a fraction of the hydrogen atoms in bond with a ring may be replaced by a substituent selected from the group consisting of alkyl groups having 1~4 carbon atoms, alkoxy groups having 1~4 carbon atoms, halogen, phenyl, substituted phenyl, and combinations of them.

A preferred form of carboxyaryl unit XVIII is:

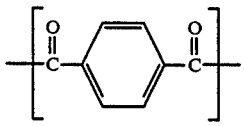

A preferred form of unit XIX is:

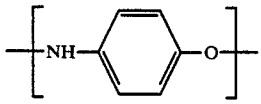

or

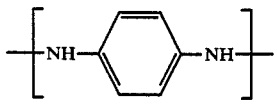

A preferred form of dioxyaryl unit XX is

Further, in the anisotropic melt phase forming polymers which can be used for the purpose of the invention, there are included polymers of such type that a part of one polymeric chain consists of a segment of any of the above described anisotropic melt phase forming polymers and the remaining part consists of a segment of a thermoplastic resin which does not form an anisotropic melt phase.

Any anisotropic melt phase forming and melt processable polymer compound used for the purpose of the invention may be allowed to contain one or more of the following: ① another kind of anisotropic melt phase forming polymer, ② thermoplastic resin which does not form an anisotropic melt phase, ③ a thermosetting resin, ④ a low-molecular weight organic compounds, and ⑤ an inorganic material. In this connection it is noted that the anisotropic melt phase forming component of such polymer compound may be thermodynamically compatible or incompatible with the remaining contents of the compound.

Available for use as said item ② thermoplastic resin are, for example, polyethylene, polypropylene, polybutylene, polybutadiene, polyisoprene, polyvinyl acetate, polyvinyl chloride, polyvinylidene chloride, polystyrene, acrylic resins, ABS resin, AS resin, BS resin, polyurethane, silicone resin, fluorine plastics, polyacetal, polycarbonate, polyethylene terephthalate, polybutylene terephthalate, aromatic polyester, polyamide, polyacrylonitrile, polyvinyl alcohol, polyvinyl ether, polyether imide, polyamide imide, polyether ether imide, polyether ether ketone, polyether sulfone, polysulfone, polyphenylene sulfide, and polyphenylene oxide.

Available for use as said item ③ thermosetting resin are, for example, phenolic resin, epoxy resin, melamine resin, urea resin, unsaturated polyester resin, and alkyd resin.

Available for use as said item ④ low-molecular organic compound are, for example, materials used generally as additives for incorporation with thermoplastic and thermosetting resins, and more specifically, low-melecular weight organic compounds used as plasticizers, light-fast and weathering stabilizers, such as antioxidants and ultraviolet absorbing agents, antistatic agents, flame retarding agents, coloring agents, such as dyes and pigments, foaming agents, cross-linking agents, such as divinyl-based compounds, peroxides, and vulcanizers, and lubricants for fluidity and releasability improvement.

Available for use as said item ⑤ inorganic material are, for example, materials used as additives for thermoplastic and thermosetting resins, that is, inorganic fibers, such as glass, carbon, metallic, ceramic, boron, and asbestos; powder materials, such as calcium carbonate, high-dispersion silicic acid, alumina, aluminum hydroxide, talc powder, mica, glass flake, glass flake, glass beads, silica flour, quartz sand, metallic powders, carbon black, barium sulfate, and baked plaster; inorganic compounds, such as silicon carbide, alumina, boron nitride, and silicon nitride; also whiskers and metallic whiskers.

The anisotropic melt phase forming polymer compound of the invention is such that when the polymer compound is melted, it polymeric chains are highly oriented even in static condition. Moreover, during melt processing operation, it exhibits a greater degree of orientation through the movement of the melt. This permits provision of higher molecular orientation in a laminated film.

There is no particular limitation on metallic films available for use in the manufacture of the laminated film of the invention. Various metals, such as for example copper, iron, aluminum, steel, stainless steel, magnesium, zinc, lead, and their alloys and composites, may be used for the purpose of the invention. A gage range of 0.005~0.076 mm is suitable for these metallic films.

For the purpose of manufacturing the laminate film in accordance with the invention may be employed a conventional laminating or coating apparatus, such as T-die type laminating unit. An anisotropic melt phase forming polymer is laminated on a metallic film by using such apparatus. A suitable thickness of the polymer laminate is 0.01~0.254 mm.

The anisotropic melt phase forming polymer which constitutes such laminate is preferably extended and melt drawn by means of a slit die of a suitable size and under appropriate temperature and pressure conditions so as to form a laminate sheet on the metallic film. The term "sheet" used herein embraces all of such varieties of comparatively thin and substantially flat structures as may often be called sheet, slab, or film in the art. Individual sheets constituting the laminate are not particulating limited in thickness. Generally, their thickness depends on the purpose for which the laminate is used. For example, the higher the required strength, the greater is the thickness required of the individual sheets. Sheets produced in this way are substantially uniaxially or unidirectionally oriented.

The presence of such uniaxial or unidirectional orientation can be determined by measuring the tensile characteristics (i.e. tensile strength) of the sheet in both longitudinal or machine direction (MD) and transverse direction (TD) in accordance with the relevant testing method of the American Society for Testing Materials, or ASTM D 882. If the ratio of the sheet tensile strength in the longitudinal direction (direction of extrusion) to that in the transverse direction exceeds about 2.0 (and is preferably within the range of about 2.0~100), the sheet has a proper degree of unidirectional orientation. More preferably, such ratio is in the range of 10~50.

In the present invention, there is no particular limitation on temperature and pressure conditions under which the liquid crystalline polymer can be extruded to form a sheet. Any person in the art can readily determine such conditions. Generally, with thermotropic liquid-crystalline polymers, extrusion operation may be carried out at temperatures within the range of about 250°~350° C. (depending upon the melting temperature for the polymer) and under pressures within the range of about 7.0~350 kg/cm$^2$.

In order to ensure that the sheet laminated on the metallic film may positively have the desired unidirectional orientation, the extruded polymer melt is desirably subjected to drawing. Generally, the required draw-down ratio exceeds about 5.0. The polymer drawn is laminated on the metallic film and subsequently slow-cooled or quenched by suitable means such as cooling roll, air blast, or water cooling.

According to the method of the invention, a thermotropic liquid crystalline polymer sheet or sheets having high tensile strength and a high degree of orientation can be integrally laminated on a metallic film in this way by melt forming. This method can easily be practiced into continuous operation on an industrial scale.

For this purpose, and without adversely affecting the high orientation behavior of the polymer constituting the sheet to be laminated on the metallic film, heating may be effected at higher temperatures than the melting temperature for the polymer. Since such polymer retains its anisotropic quality in melt phase, it is possible to avoid the use of an adhesive or the like in bonding the sheet integrally to the metallic sheet. If desired, however, a bond-phase forming polymer may be used as a third component. Conventional adhesives may be used for the purpose of the bond phase. They include, among others, hot-melt type adhesives, such as ethylenevinyl acetate copolymer, polyamide, and rubber, and thermosetting type adhesives, such as epoxy resin, urethane resin, diallyl terephthalate resin, and polyimide.

Laminates manufactured in accordance with the invention may, in some cases, be further improved in mechanical properties by subjecting them to subsequent heat treatment.

EFFECTS OF THE INVENTION

According to the invention, an anisotropic melt phase forming polymer is complexed with a metallic film, whereby a composite film having exceptionally high chemical resistance and excellent gas barrier properties and further having good mechanical strength can be produced in a continuous process employing conventional techniques. Therefore, the invention can readily be put in industrial practice. The laminated film thus produced is available for advantageous use in various fields of application, such as packaging, sheet molding, electric and electronic wiring substrates, and part and body material.

EXAMPLES

The following examples are presented to further illustrate the invention. However, these examples are not to be construed to limit the scope of the invention.

EXAMPLES 1~8

Pellets of various different thermotropic liquid-crystalline polymers (resins A, B, C and D), which will be described hereinafter, were dried at 140° C. for 7 hours in advance. Each of the polymers was extruded at a speed of 2.72 m/min by employing a T die extruder-type lamination unit so that it was laminated on a 0.05 m/m-thick metallic film to a width of 8.15 cm and to a thickness of 0.10 m/m. Thus, a laminated film, 8.15 cm wide and 0.15 m/m thick, was obtained. A melt draw-down ratio of 14.3 was applied in this operation.

The laminated films thus obtained were examined in accordance with ASTM D 882 to measure their tensile strength in two directions, i.e., main axial direction (MD) and a direction rectangular to the main axis. The results are shown in Table 1.

COMPARATIVE EXAMPLES 1~4

Films of only the thermotropic liquid crystalline polymers used in the Examples were examined to measure their tensile strength in a main axial direction (MD) and a reaction rectangular thereto (TD).

The anisotropic melt-phase forming polymers A, B, C and D used in preparing the laminated films had the following constituent units.

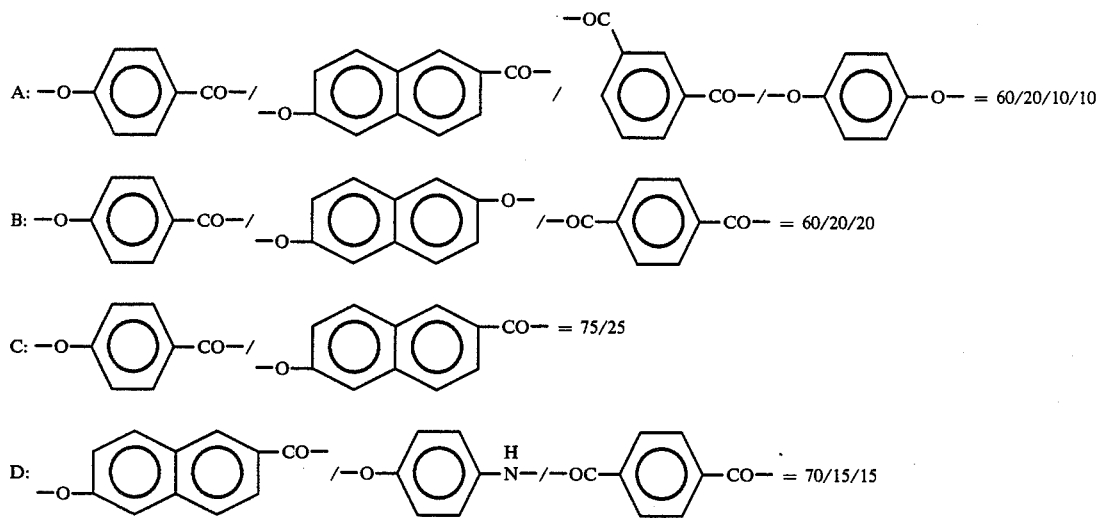

RESIN A

Into a reactor having a stirrer a nitrogen intake pipe, and a distillation pipe were charged 1081 parts by weight of 4-acetoxybenzoic acid, 460 parts by weight of 6-acetoxy-2-naphthoic acid, 166 parts by weight of isophthalic acid, and 194 parts by weight of 1,4-diacetoxybenzene. The mixture was heated to 260° C. in nitrogen gas streams. While acetic acid was being distilled from the reactor, stirring was effected for 2.5 hours at 260° C., followed by vigorous stirring for 3 hours at 280° C. The temperature was then raised at 320° C. and nitrogen introduction was stopped. Thereafter, the pressure in the reactor was gradually reduced to 0.1 mmHg in 15 minutes. Stirring was carried out for one hour under the temperature and pressure conditions thus reached.

The polymer obtained had an inherent viscosity of 5.0 as measured in a pentaflurophenolic solution of 0.1 wt % concentration at 60° C.

RESIN B

Into a reactor having a stirrer, a nitrogen intake pipe, and a distillation pipe were charged 1081 parts by weight of 4-acetoxybenzoic acid, 489 parts by weight of 2,6-diacetoxynapthalene, and 332 parts by weight of terephthalic acid. The mixture was heated to 250° C. in nitrogen gas treams. While acetic acid was being distilled from the reactor, stirring was effected for 2 hours at 250° C., followed by vigorous stirring for 2.5 hours at 280° C. The temperature was then raised to 320° C. and nitrogen introduction was stopped. Thereafter, the pressure in the reactor was gradually reduced to 0.2 mmHg in 30 minutes. Stirring was carried out for 1.5 hours under the temperature and pressure conditions thus reached.

The polymer obtained had an inherent viscosity of 2.5 as measured in a pentafluorophenolic solution of 0.1 wt % concentration at 60° C.

RESIN C

Into a reactor having a stirrer, a nitrogen intake pipe, and a distillation pipe was charged 1351 parts by weight of 4-acetoxybenzoic acid, and 576 parts by weight of 6-acetoxy-2-naphthoic acid. The mixture was heated to 250° C. in nitrogen gas streams. While acetic acid was being distilled from the reactor, stirring was effected for 3 hours at 250° C., followed by vigorous stirring for 2 hours at 280° C. The temperature was then raised to 320° C. and nitrogen introduction was stopped. Thereafter, the pressure in the reactor was gradually reduced to 0.1 mmHg in 20 minutes. Stirring was carried out for one hour under the temperature and pressure conditions thus reached.

The polymer obtained had an inherent viscosity of 5.4 as measured in a pentafluorophenolic solution of 0.1 wt % concentration at 60° C.

RESIN D

Into a reactor having a stirrer, a nitrogen intake pipe, and a distillation pipe were charged 1612 parts by weight of 6-acetoxy-2-naphthoic acid, 290 parts by weight of 4-acetoxyacetoanilide, 249 parts by weight of terephthalic acid, and 0.4 parts by weight of sodium acetate. The mixture was heated to 250° C. in nitrogen gas streams. While acetic acid was being distilled from the reactor, stirring was effected for one hour at 250° C., followed by vigorous stirring for 3 hours at 300° C. The temperature was then raised to 340° C. and nitrogen introduction was stopped. Thereafter, the pressure in the reactor was gradually reduced to 0.2 mmHg in 30 minutes. Stirring was carried out for 30 minutes under the temperature and pressure conditions thus reached.

The polymer obtained had an inherent viscosity of 3.9 as measured in a pentafluorophenolic solution of 0.1 wt % concentration at 60° C.

TABLE 1

| No. | Metallic film | Resin | Tensile strength (MPa) |
|---|---|---|---|
| Example 1 | Aluminum | A | MD 422 |
|  |  |  | TD 152 |
| Example 2 | " | B | MD 426 |
|  |  |  | TD 150 |
| Example 3 | " | C | MD 435 |
|  |  |  | TD 150 |
| Example 4 | " | D | MD 487 |
|  |  |  | TD 152 |
| Example 5 | Copper | A | MD 429 |
|  |  |  | TD 171 |
| Example 6 | " | B | MD 432 |
|  |  |  | TD 170 |

TABLE 1-continued

| No. | Metallic film | Resin | Tensile strength (MPa) |
|---|---|---|---|
| Example 7 | " | C | MD 441 |
|  |  |  | TD 171 |
| Example 8 | " | D | MD 495 |
|  |  |  | TD 172 |
| Comp. Example 1 | — | A | MD 463 |
|  |  |  | TD 26.8 |
| Comp. Example 2 | — | B | MD 467 |
|  |  |  | TD 26.1 |
| Comp. Example 3 | — | C | MD 477 |
|  |  |  | TD 26.6 |
| Comp. Example 4 | — | D | MD 535 |
|  |  |  | TD 27.3 |

The embodiments of the invention in which an exclusive privilege or property is claimed are defined as follows:

1. A laminated film comprising a metallic film having laminated thereon, a layer of an anisotropic melt phase forming polymer selected from the group consisting of polyazomethyne, polycarbonate and polyester.

2. The laminated film of claim 1, wherein the metallic film has a thickness of 0.005 to 0.076 mm and the layer has a thickness of 0.01 to 0.254 mm.

3. The laminated film of claim 1, wherein the polymer is polyazomethyne.

4. The laminated film of claim 3, wherein the polyazomethyne is selected from the group consisting of poly-(nitrilo-2-methyl-1,4-phenylene nitriloethylidene-1,4-phenylene ethylidene), poly-(nitrilo-2-methyl-1,4-phenylene nitrilomethylidene-1,4-phenylene methylidene) and poly-(nitrilo-2-chloro-1,4-phenylene nitrilomethylidene-1,4-phenylene methylidene).

5. The laminated film of claim 1, wherein the polymer is polycarbonate.

6. The laminated film of claim 5, wherein the polycarbonate consists essentially of units selected from 4-oxybenzoyl, dioxyphenyl, dioxycarbonyl or terephthaloyl.

7. The laminated film of claim 1, wherein the polyester is a polythioester.

8. The laminated film of claim 7, wherein the polyester is a polythioester comprising one or more aromatic thiocarboxylic acids.

9. The laminated film of claim 7, wherein the polyester is a polythioester comprising one or more members selected from the group consisting of aromatic dicarboxylic acids, alicyclic dicarboxylic acids and mixtures thereof; and one or more members selected from the group consisting of aromatic dithiols, aromatic thiophenols and mixtures thereof.

10. The laminated film of claim 8, wherein the aromatic thiocarboxylic acids are selected from 4-mercaptobenzoic acid, 3-mercaptobenzoic acid, 6-mercapto-2-naphthoic acid, 7-mercapto-2-naphthoic acid or mixtures thereof.

11. The laminated film of claim 9, wherein the aromatic dithiols are selected from benzene-1,4-dithiol, benzene-1,3-dithiol, 2,6-naphthalene-dithiol, 2,7-naphthalene-dithiol or mixtures thereof.

12. The laminated film of claim 9, wherein the aromatic thiophenols are selected from 4-mercaptophenol, 3-mercaptophenol, 6-mercaptophenol, 7-mercaptophenol or mixtures thereof.

13. The laminated film of claim 9, wherein the polythioester further comprises one or more aromatic thiocarboxylic acids.

14. The laminated film of claim 10, wherein the polythioester further comprises one or more aromatic thiocarboxylic acids.

15. The laminated film of claim 11, wherein the polythioester further comprises one or more aromatic thiocarboxylic acids.

16. The laminated film of claim 12, wherein the polythioester further comprises one or more aromatic thiocarboxylic acids.

17. The laminated film of claim 1, wherein the polyester is a polyester amide.

18. The laminated film of claim 17, wherein the polyester is a polyester amide comprising one or more members selected from the group consisting of aromatic dicarboxylic acids, alicyclic dicarboxylic acids and mixtures thereof; one or more aromatic hydroxy-carboxylic acids; and one or more members selected from the group consisting of aromatic hydroxyamines, aromatic diamines and mixtures thereof.

19. The laminated film of claim 18, wherein the aromatic hydroxyamines are selected from 4-aminophenol, N-methyl-aminophenol, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenyl methane, 4-amino-4'-hydroxydiphenyl sulfide or mixtures thereof.

20. The laminated film of claim 18, wherein the aromatic diamines are selected from 1,4-phenylene-diamine, N-methyl-1,4-phenylene-diamine, N,N'-dimethyl-1,4-phenylene-diamine, 4,4'-diaminophenyl sulfide (thiodianiline), 4,4'-diaminodiphenyl sulfone, 2,5-diaminotoluene, 4,4'-ethylenedianiline, 4,4'-diaminodiphenoxy ethane, 4,4'-diaminodiphenyl methane (methylene dianiline), 4,4'-diaminodiphenyl ether (oxydianiline) or mixtures thereof.

21. The laminated film of claim 18, wherein the polyester amide further comprises one or more members selected from the group consisting of aromatic diols, alicyclic diols, aliphatic diols and mixtures thereof.

22. The laminated film of claim 19, wherein the polyester amide further comprises one or more members selected from the group consisting of aromatic diols, alicyclic diols, aliphatic diols and mixtures thereof.

23. The laminated film of claim 20, wherein the polyester amide further comprises one or more members selected from the group consisting of aromatic diols, alicyclic diols, aliphatic diols and mixtures thereof.

24. The laminated film of claim 17, wherein the polyester comprises one or more aromatic hydroxy-carboxylic acids.

25. The laminated film of claim 24, wherein the aromatic hydroxy-carboxylic acids are selected from 4-hydroxy benzoic acid, 3-hydroxy benzoic acid, 6-hydroxy-2-naphthoic acid, 6-hydroxy-1-naphthoic acid, 3-methyl-4-hydroxy benzoic acid, 3,5-dimethyl-4-hydroxy benzoic acid, 2,6-dimethyl-4hydroxy benzoic acid, 3-methoxy-4-hydroxy benzoic acid, 3,5-dimethoxy-4-hydroxy benzoic acid, 6-hydroxy-5-methyl-2-naphthoic acid, 6-hydroxy-5-methoxy-2-naphthoic acid, 3-chloro-4-hydroxy benzoic acid, 2-chloro-4-hydroxy benzoic acid, 2,3-dichloro-4-hydroxy benzoic acid, 3,5-dichloro-4-hydroxy benzoic acid, 2,5-dichloro-4-hydroxy benzoic acid, 3-bromo-4-hydroxy benzoic acid, 6-hydroxy-5-chloro-2-naphthoic acid, 6-hydroxy-7-chloro-2-naphthoic acid, 6-hydroxy-5,7-dichloro-2-naphthoic acid or mixtures thereof.

26. The laminated film of claim 1, wherein the polyester comprises one or more members selected from the group consisting of aromatic dicarboxylic acids, alicyclic dicarboxylic acids and mixtures thereof; and one or more members selected from the group consisting of aromatic diols, alicyclic diols, aliphatic diols and mixtures thereof.

27. The laminated film of claim 26, wherein the aromatic dicarboxylic acids are selected from terephthalic acid, 4,4'-diphenyl dicarboxylic acid, 4,4'-triphenyl dicarboxylic acid, 2,6-naphthalene dicarboxylic acid, diphenyl ether-4,4'-dicarboxylic acid, diphenoxy ethane-4,4'-dicarboxylic acid, diphenoxy butane-4,4'-dicarboxylic acid, diphenyl ethane-4,4'-dicarboxylic acid, isophthalic acid, diphenyl ether-3,3'-dicarboxylic acid, diphenoxy ethane-3,3'-dicarboxylic acid, diphenyl ethane-3,3'-dicarboxylic acid, and naphthalene-1,6-dicarboxylic acid, chloro-terephthalic acid, dichloroterephthalic acid, bromo-terephthalic acid, methyl terephthalic acid, dimethyl terephthalic acid, ethyl terephthalic acid, methoxy terephthalic acid, ethoxy terephthalic acid, or mixtures thereof.

28. The laminated film of claim 26, wherein the alicyclic dicarboxylic acids are selected from trans-1,4-cyclohexane dicarboxylic acid, cis-1,4-cyclohexane dicarboxylic acid, 1,3-cyclohexane dicarboxylic acid, trans-1,4-(1-methyl)cyclohexane dicarboxylic acid, trans-1,4-(1-chloro)cyclohexane dicarboxylic acid or mixtures thereof.

29. The laminated film of claim 26, wherein the aromatic diols are selected from hydroquinone resorcinol, 4,4'-dihydroxy diphenyl, 4,4'-dihydroxy triphenyl, 2,6-naphthalene diol, 4,4'-dihydroxy diphenyl ether, bis-(4-hydroxyphenoxy)ethane, 3,3'-dihydroxy diphenyl, 3,3'-dihydroxy diphenyl ether, 1,6-naphthalene diol, 2,2-bis(4-hydroxy phenyl)propane, 2,2-bis(4-hydrodyphenyl)methane, alkyl-, alkoxy-, or halogen-substituted derivatives thereof or mixtures thereof.

30. The laminated film of claim 26, wherein the alicyclic diols are trans-1,4-cyclohexane diol, cis-1,4-cyclohexane diol, trans-1,4-cyclohexane dimethanol, trans-1,3-cyclohexane diol, cis-1,2-cyclohexane diol, and trans-1,3-cyclohexane dimethanol, trans-1,4-(1-methyl)cyclohexane diol, trans-1,4-(1-chloro)cyclohexane diol, or mixtures thereof.

31. The laminated film of claim 26, wherein the aliphatic diols are selected from ethylene glycol, 1,3-propane diol, 1,4-butane diol, neopentyl glycol or mixtures thereof.

32. The laminated film of claim 26, wherein the polyester further comprises one or more aromatic hydroxycarboxylic acids.

33. The laminated film of claim 32, wherein the aromatic hydroxy-carboxylic acids are selected from 4-hydroxy benzoic acid, 3-hydroxy benzoic acid, 6-hydroxy-2-naphthoic acid, 6-hydroxy-1-naphthoic acid, 3-methyl-4-hydroxy benzoic acid, 3,5-dimethyl-4-hydroxy benzoic acid, 2,6-dimethyl-4-hydroxy benzoic acid, 3-methoxy-4-hydroxy benzoic acid, 3,5-dimethoxy-4-hydroxy benzoic acid, 6-hydroxy-5-methyl-2-naphthoic acid, 6-hydroxy-5-methoxy-2-naphthoic acid, 3-chloro-4-hydroxy benzoic acid, 2-chloro-4-hydroxy benzoic acid, 2,3-dichloro-4-hydroxy benzoic acid, 3,5-dichloro-4-hydroxy benzoic acid, 2,5-dichloro-4-hydroxy benzoic acid, 3-bromo-4-hydroxy benzoic acid, 6-hydroxy-5-chloro-2-naphthoic acid, 6-hydroxy-7-chloro-2-naphthoic acid, 6-hydroxy-5,7-dichloro-2-naphthoic acid or mixtures thereof.

34. The laminated film of claim 26, wherein the polyester has a weight average molecular weight of from about 2,000-200,000.

35. The laminated film of claim 17, wherein the polyester amide has a weight average molecular weight of from about 5,000-50,000.

36. The laminated film of claim 35, wherein the polyester exhibits a logarithmic viscosity number of at least about 2.0 to 10.0 dl/g, when dissolved at a concentration of 0.1 wt.% in pentafluorophenol at 60° C.

37. The laminated film of claim 35, wherein the polyester exhibits a logarithmic viscosity number of at least about 2.0 to 10.0 dl/g, when dissolved at a concentration of 0.1 wt.% in pentafluorophenol at 60° C.

38. The laminated film of claim 26, wherein the polyester comprises about 10 mol % or more of 6-hydroxy-2-naphthalene, 2,6-dihydroxy naphthalene, 2,6-dicarboxy naphthalene or mixtures thereof.

39. The laminated film of claim 19, wherein the polyester amide comprises about 10 mol% or more of 6-hydroxy-2-naphthalene, 2,6-hydroxy naphthalene, 2,6-dicarboxy naphthalene or mixtures thereof; and 4-aminophenol or 1,4-phenylenediamine.

40. The laminated film of claim 1, wherein the polyester is a member selected from (a) a polyester containing about 10 to 90 mol% of units of

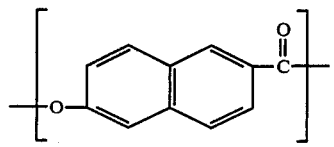

and about 10 to 90 mol% of units of

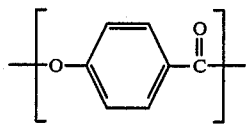

(b) a polyester containing about 40–60 mol% of units of

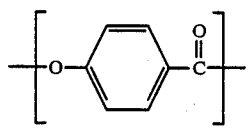

about 20–30 mol% of units of

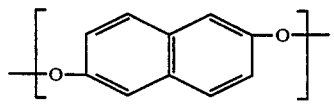

about 20–30 mol% of units of

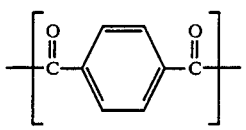

(c) a polyester containing about 20–60 mol% of units of

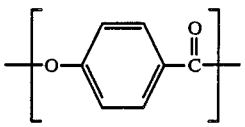

about 5–18 mol% of units of

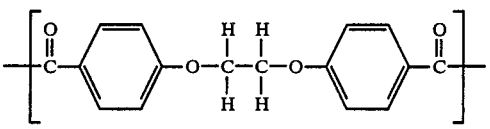

about 5–35 mol% of units of

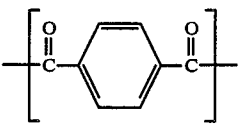

and about 20–40 mol% of units of

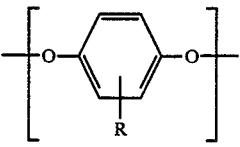

wherein R represents methyl, chloro, bromo or mixtures thereof,
(d) a polyester containing about 20–40 mol% of units of

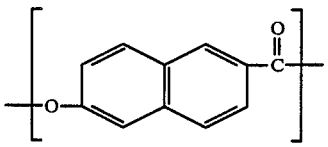

about 10 mol%–50 mol% of units of

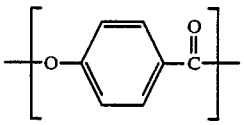

about 5–30 mol% of dioxyaryl units of [—O—Ar—O—], wherein Ar represents a bivalent group containing at least one aromatic ring; and
about 5–30 mol% of dicarboxyaryl units of

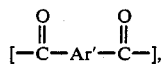

wherein Ar' represents a bivalent group containing at least one aromatic ring, or
(e) a polyester containing 10–90 mol% of units of

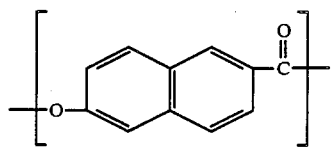

about 5–45 mol% of dioxyaryl units of [—O—Ar—O—] wherein Ar denotes a bivalent group inlcuding at least one aromatic ring, and
about 5–45 mol% dicarboxyaryl units of

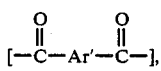

wherein Ar' denotes a bivalent group including at least one aromatic ring.

41. The laminated film of claim 17, wherein the polyester is a polyester amide containing 10–90 mol% of units of

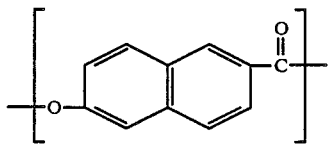

about 5–45 mol% of units of

wherein A represents a bivalent group including at least one aromatic ring, or a bivalent trans-cyclohexane group;
about 5–45 mol% of units of

[—Y—Ar—Z—]

wherein Ar represents a bivalent group including at least one aromatic ring; Y represents O, NH, or NR; Z represents NH or NR; and R represents an alkyl or aryl group having about 1 to 6 carbon atoms; and
about 0–40 mol% of units of

[—O—Ar'—O—]

wherein in Ar' represents a bivalent group including at least one aromatic ring.

42. The laminated film of claim 1, wherein said anisotropic melt phase forming polymer further comprises:
thermoplastic resins selected from the group consisting of polyethylene, polypropylene, polybutylene, polybutadiene, polyisoprene, polyvinyl acetate, polyvinyl chloride, polyvinylidene chloride, polystyrene, acrylic resins, ABS resin, AS resin, BS resin, polyurethane, silicone resin, fluorine plastics, polyacetal, polycarbonate, polyethylene terephthalate, polybutylene terephthalate, aromatic polyester, polyamide, polyacrylonitrile, polyvinyl alcohol, polyvinyl ether, polyether imide, polyamideimide, polyether ether imide, polyether ether ketone, polyether sulfone, polysulfone, polyphenylene sulfide and polyphenylene oxide.

43. The laminated film of claim 1, wherein said anisotropic melt phase forming polymer further comprises:
thermosetting resins selected from the group consisting of phenolic resin, epoxy resin, melamine resin, urea resin, unsaturated polyester resin and alkyd resin.

44. The laminated film of claim 1, wherein said anisotropic melt phase forming polymer further comprises:
low-molecular weight organic plasticizers, light fast or weathering stabilizers, antistatic agents, flame retarding agents, coloring agents, foaming agents, crosslinking agents, lubricants or mixtures thereof.

45. The laminated film of claim 1, wherein said anisotropic melt phase forming polymer further comprises:
an inorganic material selected from the group consisting of glass, carbon, metallic, ceramic, boron, and asbestos; calcium carbonate, high-dispersion silicic acid, alumina, aluminum hydroxide, talc powder, mica, glass flake, glass beads, silica flour, quartz sand, metallic powder, carbon black, barium sulfate, baked plaster, silicon carbide, alumina, boron nitride, silicon nitride, whiskers and metallic whiskers.

46. The laminated film of claim 1, wherein the metallic film is selected from the group consisting of copper, iron, aluminum, steel, stainless steel, magnesium, zinc, lead, and alloys and composites thereof.

* * * * *